US008792087B2

(12) United States Patent
Spickermann et al.

(10) Patent No.: US 8,792,087 B2
(45) Date of Patent: Jul. 29, 2014

(54) CONCEPT FOR OPTICAL DISTANCE MEASUREMENT

(75) Inventors: Andreas Spickermann, Bottrop (DE); Werner Brockherde, Duisburg (DE); Bedrich J. Hosticka, Muelheim a.d.R. (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 735 days.

(21) Appl. No.: 12/855,909

(22) Filed: Aug. 13, 2010

(65) Prior Publication Data
US 2011/0037969 A1 Feb. 17, 2011

(30) Foreign Application Priority Data
Aug. 14, 2009 (DE) .......................... 10 2009 037 596

(51) Int. Cl.
*G01C 3/08* (2006.01)

(52) U.S. Cl.
USPC ........................................................ 356/5.01

(58) Field of Classification Search
USPC ........................................................ 356/5.01
See application file for complete search history.

(56) References Cited

U.S. PATENT DOCUMENTS

| 5,804,845 | A  | * | 9/1998  | Anagnostopoulos et al. | 257/231 |
| 5,835,141 | A  | * | 11/1998 | Ackland et al. | 348/308 |
| 7,170,041 | B2 | * | 1/2007  | Rahn | 250/208.1 |
| 7,436,496 | B2 | * | 10/2008 | Kawahito | 356/5.01 |
| 7,718,946 | B2 | * | 5/2010  | Kang et al. | 250/208.1 |
| 2006/0108611 | A1 | * | 5/2006 | Seitz | 257/222 |
| 2006/0128087 | A1 |  | 6/2006 | Bamji et al. | |
| 2007/0158770 | A1 |  | 7/2007 | Kawahito | |
| 2008/0079833 | A1 | * | 4/2008 | Ichikawa et al. | 348/311 |
| 2009/0014658 | A1 |  | 1/2009 | Cottier et al. | |
| 2009/0134396 | A1 |  | 5/2009 | Kawahito et al. | |
| 2010/0123771 | A1 | * | 5/2010 | Moon et al. | 348/46 |
| 2010/0231891 | A1 | * | 9/2010 | Mase et al. | 356/5.01 |

FOREIGN PATENT DOCUMENTS

EP  2 322 953 A1  5/2011

OTHER PUBLICATIONS

Hu, Chenming, Modern Semiconductor Devices for Integrated Circuits, Apr. 2009, Chapter 5.*
Official Communication issued in corresponding European Patent Application No. 10172810.3, mailed on Apr. 10, 2013.
Sawada et al., "TOF Range Image Sensor Using a Range-Shift Technique," 2008 IEEE Sensors Conference, 2008, pp. 1390-1393.

* cited by examiner

*Primary Examiner* — Luke Ratcliffe
*Assistant Examiner* — Vicente Rodriguez
(74) *Attorney, Agent, or Firm* — Keating & Bennett, LLP

(57) ABSTRACT

The present invention relates to a concept for optical distance measurement, wherein a radiation pulse is emitted in the direction of an object of measurement. At least two different transfer gates which couple a photoactive region to at least two different evaluating capacities are driven during different drive intervals so that charge carriers generated during the drive intervals by a radiation pulse reflected from the object of measurement and/or by ambient radiation can be transported from the photoactive region to the evaluating capacities each coupled to the at least two transfer gates. Another transfer gate is driven during a time outside the drive intervals of the at least two transfer gates to connect the photoactive region to a reference potential terminal acting as a charge carrier sink during the time outside the drive intervals of the at least two transfer gates.

21 Claims, 8 Drawing Sheets

CONCEPT FOR OPTICAL DISTANCE MEASUREMENT

CROSS-REFERENCE TO RELATED APPLICATION

This application claims priority from German Patent Application No. 10 2009 037 596.1, which was filed on Aug. 14, 2009, and is incorporated herein by reference in its entirety.

BACKGROUND OF THE INVENTION

The present invention relates to a concept for optical distance measurement, as may exemplarily be used in so-called ToF (Time of Flight) three-dimensional imaging.

There are various applications in which optical radiation is to be detected. Cheap CMOS (Complementary Metal-Oxide Semiconductor) image sensors and camera systems have become standard elements of everyday life. In particular in the consumer field, digital and cell phone cameras have developed to become a mass product and it is hard to imagine these not to be there. In the field of special applications as well, cheap CMOS cameras are becoming more and more interesting compared to high-quality but considerably more expensive CCD (Charge-Coupled Device) image sensors. In particular realizing a photodetector and post-processing read-out electronics on a chip in accordance with the so-called "camera-on-a-chip" approach is one big advantage of CMOS image sensorics compared to CCD technology.

One special field of CMOS image sensorics relates to contactless distance measurement based on the so-called time-of-flight (ToF) principle. Here, active illumination in the form of pulsed or continuously modulated optical radiation is used to determine a distance of the sensor to an object of measurement directly or indirectly using the runtime of the optical radiation reflected. Depending on the field of application, high performance requirements may result for such a ToF sensor. Intelligent distance-measuring systems in automobiles, for example, have to operate at very high speeds so as to be able to provide real-time measurement data. At the same time, the sensor must be able to work perfectly under greatly varying environmental influences, such as, for example, fog, darkness, bad weather conditions or extreme backlight situations. These requirements can be fulfilled using highly dynamic CMOS image sensors and efficient read-out methods for ambient light suppression.

Apart from the usage as a distance sensor in automobiles, there are other fields of application for ToF sensors, such as, for example, three-dimensional inspection/positioning systems or automotive systems. Monitoring an automobile's interior, airbag control, theft protection systems, lane recognition systems, pre-crash sensorics, pedestrian protection and parking aids are potential fields of application for this. Additionally, ToF sensors may be used for topography measurements, for monitoring systems in the security field, for imaging systems for medical technology, in consumer electronics (such as, for example, gaming consoles) or for functional machine security.

Various methods of ToF-based distance or depth measurement have evolved over the last few years. FIG. 1 shows a setup of a measuring arrangement 100 which, however, is identical for all ToF systems, in a schematic illustration. A modulated radiation or light source 102 here illuminates an object of measurement 104 in a space with an illumination intensity $E_{light,source}$. After being reflected at the object of measurement 104, a light beam or light pulse hits a CMOS image sensor 106 after passing a distance 2d. d represents a distance between the measurement system and the object of measurement 104. The light impinging on the image sensor 106 consists of, on the one hand, a reflected light portion $E_{light,source,r}$ and, on the other hand, ambient light $E_{amb}$. A runtime delay $T_d$ of the light emitted can be determined by a synchronization of the light source 102 and the image sensor 106, which, according to:

$$d = \frac{c}{2}T_d \qquad (1)$$

is directly proportional to the distance d between the sensor 106 and the object of measurement 104. In equation (1), represents the speed of light.

Typically, the image sensor 106 is implemented as a semiconductor photo sensor and image converter, which is also referred to as a so-called active pixel sensor (APS) and comprises active circuit elements associated to each pixel, in particular semiconductor image converters employing photodiodes and/or photogates including so-called Correlated Double Sampling (CDS). Active pixel sensors are semiconductor image converters in which each pixel contains typical semiconductor pixel elements, among other things photosensitive regions, resetting means, means for converting charge to voltage and, additionally, all parts of an amplifier. The photo charge generated in a pixel by illumination is converted to a corresponding voltage or a corresponding current.

Known ToF pixel structures which may be employed and/or modified in connection with the present invention will be described below using FIGS. 2 and 3.

FIG. 2 shows a pixel structure 200 based on a pinned photodiode in a schematic cross-section.

The ToF pixel structure 200 is formed in a p⁻-epi layer or lightly doped epitaxial p-type layer 202 which is arranged on a p⁺-type or heavily doped p-type substrate 204. As can be seen, the pinned photodiode 206 is formed of an n-doped well 208 in the layer 202 at the exposed side of which in turn a p⁺-doped region 210 is arranged. The p⁺-doped region 210 has the effect that a potential well of the photodiode 206 is removed from the surface and that dark currents, for example, can be minimized. The p⁺-doped region 210 is connected to ground for this. A space charge zone forms at the edges between the n-doped well 208, the p⁺-doped region 210 and the p⁻-epi layer 202, the n-well being depleted of free charge carriers. The reference numeral 218 characterizes a parasitic capacity the spectral sensitivity of which is negligible. Two more n⁺-doped regions 220 and 222 are formed at the exposed surface of the layer 202, the first one of these forming a transistor or MOS (metal-oxide semiconductor) transistor in connection with the n-well 210, which will subsequently also be referred to as transfer switch or transfer gate TG, and comprising a gate electrode 224 extending above the n-well 210 and the n⁺-type region 220 and therebetween and being separated from the n-well 210 and the n⁺-type region 220 by a silicon dioxide layer 226. Similarly, a layer arrangement of a silicon dioxide layer 228 and a gate electrode 230 extends between the n⁺-type region 220 and the n⁺-type region 222 so as to form a transistor or MOS transistor functioning as a reset switch. As is shown in FIG. 2, the pn junction between the n⁺-type region 220 and the p⁻-type layer 202 forms a read-out or evaluating capacity $C_{FD}$ which is also referred to as a floating-diffusion capacity. The transfer gate TG and the reset transistor can be driven by a control circuit (not shown) such that, caused by an illumination of a photoactive region formed by the pinned photodiode, charge carriers flow from the photoactive region via the transfer gate to the evaluating capacity $C_{FD}$ and can, from there be processed in order to perform distance measurement based thereon. The transfer gate consequently is a switch which connects the photoactive region formed by the photodiode 214 to the evaluating capacity $C_{FD}$ formed by the junction between the $n^+$-type region 220 and the $p^-$-type layer 202, when the switch is closed, i.e. when the gate electrode 224 is driven correspondingly.

Another exemplary ToF pixel structure 300 based on a photogate is shown in FIG. 3 in cross-section.

Like the pixel structure 200 in accordance with FIG. 2, the pixel structure 300 in accordance with FIG. 3, too, is formed on a lightly-doped epitaxial p-type layer 302 which is arranged on a heavily doped p-type substrate 304. Only exemplarily, a layer 306 referred to as a p-well, in which different components of the ToF pixel structure 300 are arranged, is arranged above the $p^-$-type layer 302, as will be described below.

Two so-called $n^+$-type floating-diffusion regions 310 and 312 (diffusion regions) are formed between the p-well 306 and a silicon dioxide layer 308 arranged thereon. These floating-diffusion regions are of a capacitive nature, i.e. are able to store charge carriers, which is indicated by $C_{FD}$. The pixel element 300 can be controlled using three electrodes or gates 314, 316 and 318 which are typically made of polycrystalline silicon (polysilicon) and arranged above the silicon dioxide layer 308. Conventional STI (Shallow Trench Isolation) structures 320 are arranged laterally outside the $n^+$-type floating-diffusion regions 310 and 312 so as to avoid leakage currents to a neighboring pixel element (not shown).

The pixel structure 300 functions as a photodetector so as to generate electron-hole pairs, depending on the penetration depth of the incident photons, in the crystalline structure of the silicon semiconductor material by photons reflected by an object of measurement 104 and entering the pixel structure 300. The structure 300 is generally referred to as a photogate photodetector since an electrical field starting from the photogate 314 results in a depletion zone 322 in the underlying p-well 306, so that charge carriers will accumulate here caused by the action of light. The depletion zone 322 starts at the surface of the p-well 306 and extends in the direction of the underlying $p^+$-type substrate 304. The depth of the depletion zone 322 depends on a thickness of the silicon dioxide layer 308, a voltage applied to the photogate 314, the p-well doping and substrate doping. When the transfer gates 316, 318 are driven, a flow of charge carriers is enabled between the depletion zone 322, i.e. the photoactive region, and the respective floating-diffusion region 310, 312. The charge carriers transferred in turn cause, at the capacities $C_{FD}$ formed by the floating-diffusion regions, voltage drops which in turn are directly proportional to the charge transferred and can be measured. When the transfer gates 316, 318 are driven at suitable points in time and the resulting charges or voltages are measured, the beginning and end of a radiation pulse reflected by the object of measurement 104 can be determined. This allows drawing conclusions as to the distance d to the object of measurement 104.

However, superpositioning useful signals $E_{light,source,r}$ and ambient light $E_{amb}$ makes exact determination of the runtime delay $T_d$ and thus the precision of the distance measurement extremely difficult. Different methods have established themselves in order to efficiently suppress ambient light. DE 198 33 207 and U.S. Pat. No. 7,186,965 each describe a read-out method operating using pulsed laser sources. By double exposure of a 3D scene (once with a laser and again without a laser), the ambient light is determined and eliminated by subsequent subtraction in this method. Additionally, two electronic "shutter" time windows of different lengths are employed so as to take the reflectance of the object of measurement and the attenuation caused by the distance of the laser pulse reflected into consideration. All in all, two corresponding laser pulse cycles are needed for determining a distance, which, on the one hand, limits the speed of the method and, on the other hand, increases the laser energy needed. Additionally, the temporal offset between the two laser pulse cycles may result in errors in the distance measurement when the sensor or the object move.

In accordance with the patent application PCT/EP2009/002570, an optimized method including an electronic double "shutter" consisting of two sample-and-hold stages is presented, which allows determining the measured values which depend on the distance and the reflectivity values using only one laser pulse. Both methods employ a standard pn photodiode and at the same time use the barrier layer capacity of the pn junction as an integration and read-out node. Other ToF methods, such as, for example, in US 2007/0158770 A1 and U.S. Pat. No. 7,436,496 B2, however, use pixel structures based on photogates or pinned photodiodes including at least two transfer gates in which the photoactive region is separated from the read-out node, i.e. the floating diffusion. By suitably synchronizing the laser pulse and driving the two transfer gates, the pixel structure is operated as a kind of "charge swing" using which the time delay $T_d$, of the reflected laser pulse and, thus, the distance d can be determined.

Efficient ambient light suppression, however, is not described in this method.

Similar photogate structures are presented in U.S. Pat. No. 6,825,455 or U.S. Pat. No. 7,060,957. In contrast to the pulsed ToF methods, however, a continuously modulated sinusoidal light source is used here. The distance information here may be reconstructed using the phase shift of the light reflected back. Due to the continuous illumination of the space, however, problems with keeping security aspects for humans may result when using this method. Only decreasing the illumination intensity can be used as a remedy, which in turn results in problems for ambient light suppression. Additionally, the scanning algorithm proves to be susceptible for ambiguities when determining the phase position.

SUMMARY

In accordance with one preferred embodiment of the present invention, a pixel structure for optical distance measurement is provided, the pixel structure having a semiconductor substrate; a photoactive region integrated on the substrate for generating charge carriers responsive to radiation incident on the photoactive region; a reference potential terminal for a reference potential acting as a charge carrier sink; a plurality of at least three evaluating capacities in the form of floating-diffusion regions which are arranged around the photoactive region so as to be laterally spaced apart from an edge of the photoactive region; a plurality of at least four transfer gates in the form of MOS capacitors configured to transport the charge carriers generated from the photoactive region, wherein at least three of the plurality of transfer gates are configured to transport the charge carriers generated from the photoactive region to a respective evaluating capacity; and a control circuit configured to cyclically drive, in each cycle: a first one of the at least three transfer gates during a first drive interval synchronized with a radiation pulse of a radiation source so that first charge carriers generated during the first drive interval can be transported from the photoactive region to a first evaluating capacity, a second one of the at least three transfer gates during a second drive interval synchronized with a radiation pulse of a radiation source which is outside first drive interval so that second charge carriers generated during the second drive interval can be transported from the photoactive region to a second evaluating capacity, a third one of the at least three transfer gates during a third drive interval outside the first and second drive intervals so that third charge carriers generated during the third drive interval can be transported from the photoactive region to a third evaluating capacity, and the other one of the four transfer gates during a time outside the first, second and third drive intervals to connect the photoactive region to the reference potential terminal, so that at least one of the plurality of the transfer gates is driven at every point in time during the cycle.

In accordance with another preferred embodiment, the present invention provides a system for optical distance measurement, comprising a radiation source for emitting a radiation pulse in the direction of an object of measurement, an inventive pixel structure and a synchronization unit for synchronizing the radiation source with the control circuit of the pixel structure so that the control circuit drives the transfer gates such that the drive intervals of the transfer gates are dependent on the radiation pulse.

In accordance with another preferred embodiment, a method for optical distance measurement by means of a pixel structure having: a semiconductor substrate, a photoactive region integrated on the substrate for generating charge carriers responsive to radiation incident on the photoactive region, a reference potential terminal for a reference potential acting as a charge carrier sink, a plurality of at least three evaluating capacities in the form of floating-diffusion regions which are arranged around the photoactive region so as to be laterally spaced apart from an edge of the photoactive region, and a plurality of at least four transfer gates in the form of MOS capacitors configured to transport the charge carriers generated from the photoactive region, wherein at least three of the plurality of transfer gates are configured to transport the charge carriers generated from the photoactive region to a respective evaluating capacity, wherein the method has the following steps which are performed cyclically per cycle: driving a first one of the at least three transfer gates during a first drive interval synchronized with a radiation pulse of a radiation source so that first charge carriers generated during the first drive interval can be transported from the photoactive region to a first evaluating capacity, driving a second one of the at least three transfer gates during a second drive interval synchronized with a radiation pulse of a radiation source which is outside the first drive interval so that second charge carriers generated during the second drive interval can be transported from the photoactive region to a second evaluating capacity, driving a third one of the at least three transfer gates during a third drive interval outside the first and second drive intervals so that third charge carriers generated during the third drive interval can be transported from the photoactive region to a third evaluating capacity, and continuously driving the other one of the four transfer gates during a time outside the first, second and third drive intervals to connect the photoactive region to the reference potential terminal, so that at least one of the plurality of the transfer gates is driven at every point in time during the cycle.

Another preferred embodiment may have a computer program for performing the steps of the above inventive method when the computer program runs on a computer or a microcontroller.

The photoactive region of the pixel structure may, in accordance with different preferred embodiment s, be implemented by a pinned photodiode, a buried photodiode or by a photogate. Generally, the photoactive region may be realized by any kind of photodiodes which offer a way for aimed charge transfer by a control gate or transfer gate (such as, for example, pixel structures including lateral drift field photodiodes). Thus, the electronical "shutter" functionality described before may be integrated directly in the ToF pixel structure by correspondingly selected drive intervals.

Each one of the plurality of transfer gates effects transport of photo-generated charge carriers from the photoactive region to a corresponding read-out node which is exemplarily formed by a floating-diffusion region having a barrier layer capacity $C_{FD}$. The transfer gates in accordance with one preferred embodiment are each formed at different edges or edge regions of the photoactive region. A radiation or light pulse reflected back and the time shift $T_d$ thereof relative to the emitted radiation or light pulse can be determined using two transfer gates and two floating-diffusion regions acting as evaluating capacities. At all other points in time outside the drive intervals of the at least two transfer gates, the photoactive region can be connected to a charge carrier sink by activating another transfer gate, and thus cause all the undesired charge carriers generated thermally and by ambient light to dissipate towards the charge carrier sink. In accordance with one preferred embodiment, the charge carrier sink is realized by a floating-diffusion region which, at all other points in time outside the drive intervals of the at least two other transfer gates, is connected to a reference potential via a reset transistor.

In accordance with one preferred embodiment, the pixel structure comprises four transfer gates, wherein the radiation pulse reflected back on the one hand and the shift thereof to the emitted radiation pulse can be determined using two transfer gates and two floating-diffusion regions. Since the radiation pulse reflected back is superpositioned by ambient light, the ambient light $E_{snb}$ may be recorded at a point close in time to the reflected pulse and then the influence thereof on the distance measurement be calculated by means of a third transfer gate. The fourth transfer gate serves for "sucking off" photo charge carriers generated by ambient light at those periods when the other three transfer gates are inactive. The fourth transfer gate here is driven continuously during all points in time outside the drive intervals of the other three transfer gates to connect the photoactive region to the charge carrier sink via the fourth transfer gate or transfer transistor during that time.

Preferred embodiment s of the present invention allow using only one laser pulse for recording the time delay $T_d$ of the pulse or the distance information d resulting from this completely. This allows halving the laser energy needed compared to conventional art and, at the same time, doubling the measuring speed. This results in an optimum correlation possible of distance and normalization measured values (reflectivity, attenuation caused by distance), which is why the inventive concept is also suitable for scenarios of strong temporal variations and/or very quickly moving objects.

In a pixel structure in accordance with a preferred embodiment of the present invention, the ambient light may be recorded nearly at the same time as the signal and subsequently be subtracted from the useful signal, thereby also increasing the measuring speed.

By separating the detection and read-out nodes, reset noise is no long dependent on the photoactive region and may thus be reduced considerably with small selected floating diffusions. This advantage is particularly prominent when using large-area photoactive regions and, at the same time, read-out nodes of small sizes.

By emitting the radiation pulse N times, an inventive ToF pixel structure also offers a way of accumulating charge carriers N times already within the floating diffusion of the pixel structure. The magnitude of the reset noise can be minimized and a dynamic range and signal-to-noise power ratio can be increased by this.

The above and other elements, features, steps, characteristics and advantages of the present invention will become more apparent from the following detailed description of the preferred embodiment s with reference to the attached drawings.

BRIEF DESCRIPTION OF THE DRAWINGS

Preferred embodiment s of the present invention will be detailed subsequently referring to the appended drawings, in which.

DETAILED DESCRIPTION OF THE INVENTION

Figure 1:
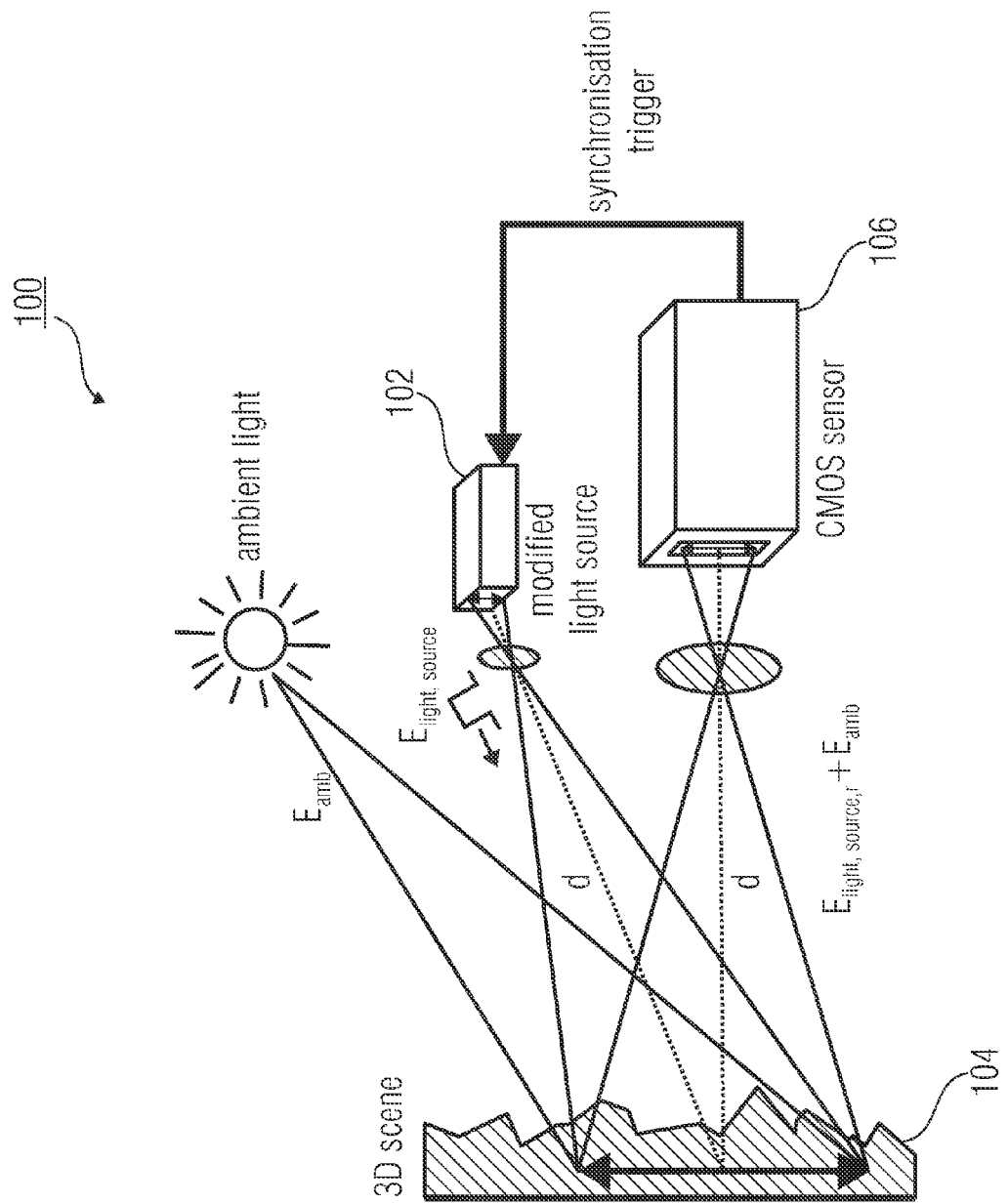
FIG. 1 is a schematic illustration of a conventional system for optical distance measurement in accordance with the ToF principle.

Before the present invention is discussed in detail referring to FIGS. 4 to 7, it is pointed out that same elements in the figures are provided with same or similar reference numerals and that a repeated description of these elements is omitted.

Additionally, it is pointed out that, in the following description of the figures, it is assumed that the pixel structures shown are a part of a system for optical distance measurement, similar to FIG. 1, which is why reference is partly made to FIG. 1 and the elements thereof, without repeating the description of the setup of FIG. 1. In particular, the pixel structures described below may exemplarily represent a single pixel of a pixel array of an image sensor 106, as will become apparent from the following description.

Figure 4:
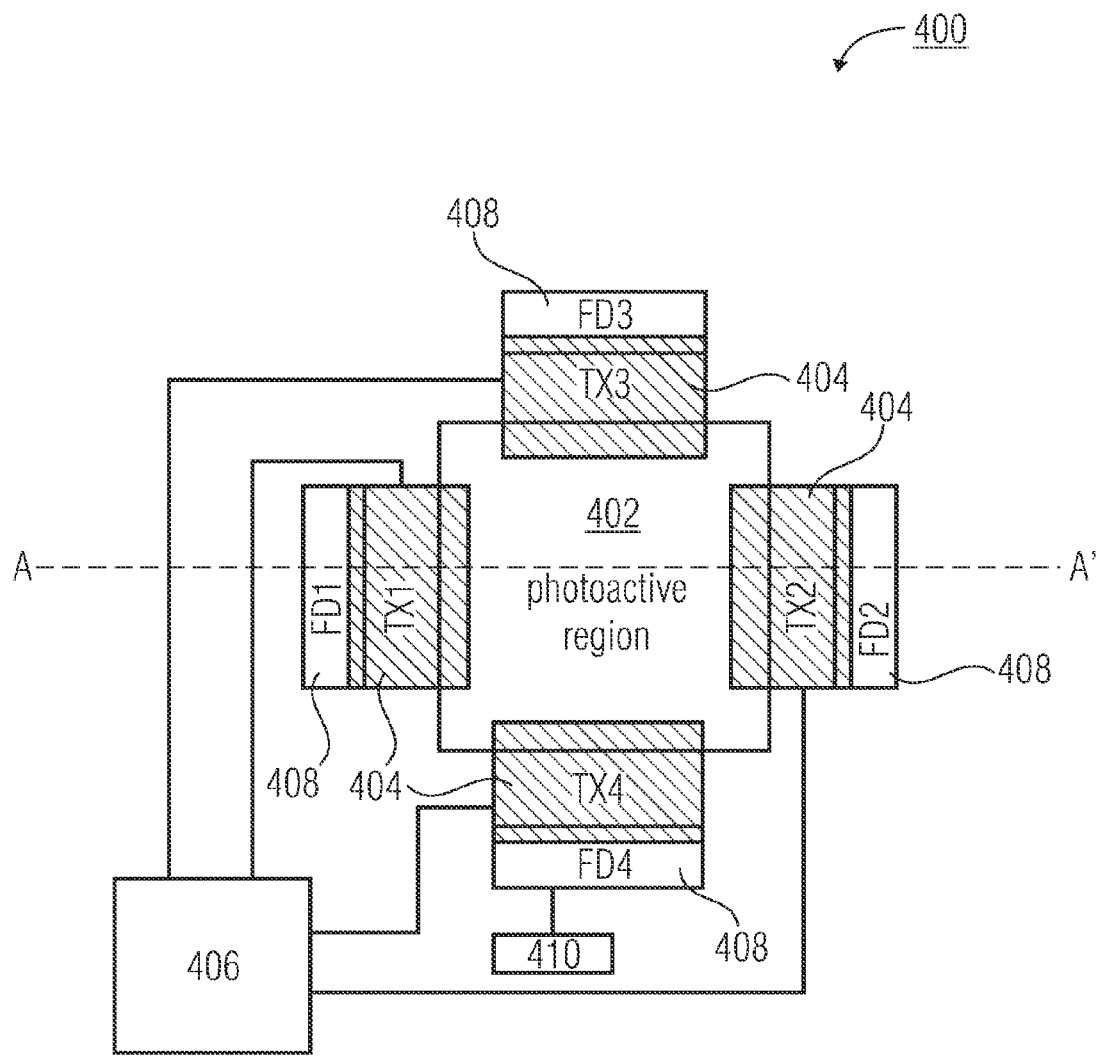
FIG. 4 is a schematic top-view illustration of a pixel structure in accordance with a preferred embodiment of the present invention.

FIG. 4 shows a pixel structure 400 in accordance with a preferred embodiment of the present invention in a schematic top-view illustration.

The pixel structure 400 comprises a photoactive or photosensitive region 402 for generating charge carriers responsive to optical radiation incident on the photoactive region 402. Additionally, a plurality of transfer gates 404-$n$ or TX$n$ ($n=1, 2, \ldots$) is provided to transport the charge carriers generated from the photoactive region 402. A control circuit 406 is provided to drive at least two different ones 404-1, 404-2 of the plurality of transfer gates during different periodical drive intervals so that charge carriers generated during the drive intervals by a radiation pulse reflected from an object of measurement 104 and/or by ambient radiation can be transported from the photoactive region 402 to read-out nodes or evaluating capacities 408-$n$ or FD$n$ ($n=1, 2, \ldots$) each coupled to the at least two transfer gates 404-1, 404-2. The control circuit 406 is additionally configured to drive another transfer gate 404-4 of the plurality of transfer gates 404-$n$ ($n=1, 2, \ldots$) during a time outside the drive intervals of the other transfer gates 404-1, 404-2 (and/or 404-3) permanently to connect the photoactive region 402 to a charge carrier sink 410 at all times outside the drive intervals of the other transfer gates. The charge carrier sink 410 in accordance with preferred embodiment s is a reference potential or reference potential terminal which couples the transfer gate 404-4 to the reference potential, wherein the reference potential may be in ranges typical of semiconductor circuits, i.e. from roughly 1 V up to roughly 5 V. Expressed in other words, an inventive pixel structure 400 includes at least three transfer gates 404-$n$ or TX$n$, wherein at least two serve for transporting photo-generated charge carriers from the photoactive region 402 to corresponding read-out nodes or capacities 408-$n$ or FD$n$, and wherein one of the transfer gates 404-4 serves for charge carrier transport from the photoactive region 402 to the charge carrier sink 410 at all times when the other transfer gates are inactive, to cause undesired charge carriers corrupting the measurement to dissipate from the photoactive region 402.

Figure 2:
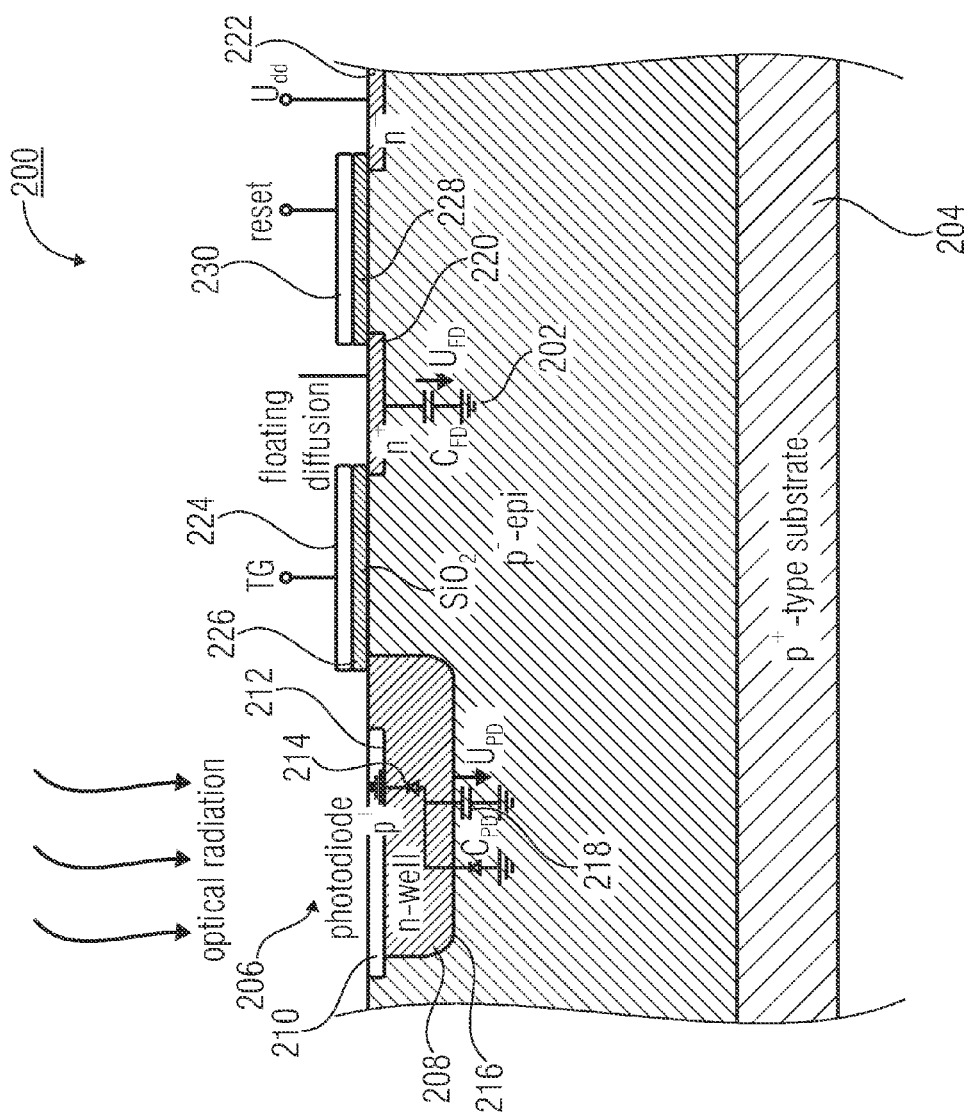
FIG. 2 is a semi-schematic cross-sectional illustration of a conventional ToF pixel structure based on a pinned photodiode.

Although three transfer or control gates are already sufficient for the present invention, FIG. 4 shows a preferred embodiment of a pixel sensor comprising four transfer gates 404-$n$ ($n=1, \ldots, 4$) which are formed at different edge regions of the photoactive region 402. The photoactive region 402 may, in accordance with different preferred embodiment s, include a pn junction as a photo-sensitive device, a PIN photodiode, a pinned photodiode or a photogate which have already been described partly referring to FIGS. 2 and 3. The photoactive region 402, which may be located in the center of the active pixel structure 400, is exemplarily indicated so as to be squared in FIG. 4, however, may also consist of polygons having more than four corners so as to improve physical transport characteristics. At four edges or edge regions of the photoactive region 402 there are transfer gates 404-$n$ ($n=1, \ldots, 4$) which allow photo-generated charge carriers to be transported from the photoactive region 402 to the respective read-out node 408-$n$ or, in the case of the transfer gate 404-4, allow photo-generated charge carriers to be transported towards the charge carrier sink 410. Using the two transfer gates 404-1 and 404-2 and the read-out capacities 408-1 and 408-2 formed by the two corresponding floating diffusions FD1 and FD2, a radiation pulse reflected back and its temporal shift $T_d$ to the emitted radiation pulse may be determined on the one hand. On the other hand, the two other transfer gates 404-3 and 404-4 and the read-out capacities 408-3 and 408-4 formed by the two corresponding floating diffusions FD3 and FD4 offer a way of receiving and effectively suppressing the ambient light in clock cycles desired, as will be discussed in greater detail below. Only a single emitted radiation pulse is needed for completely recording the time delay $T_d$ of the radiation pulse reflected or distance information d.

Figure 5:
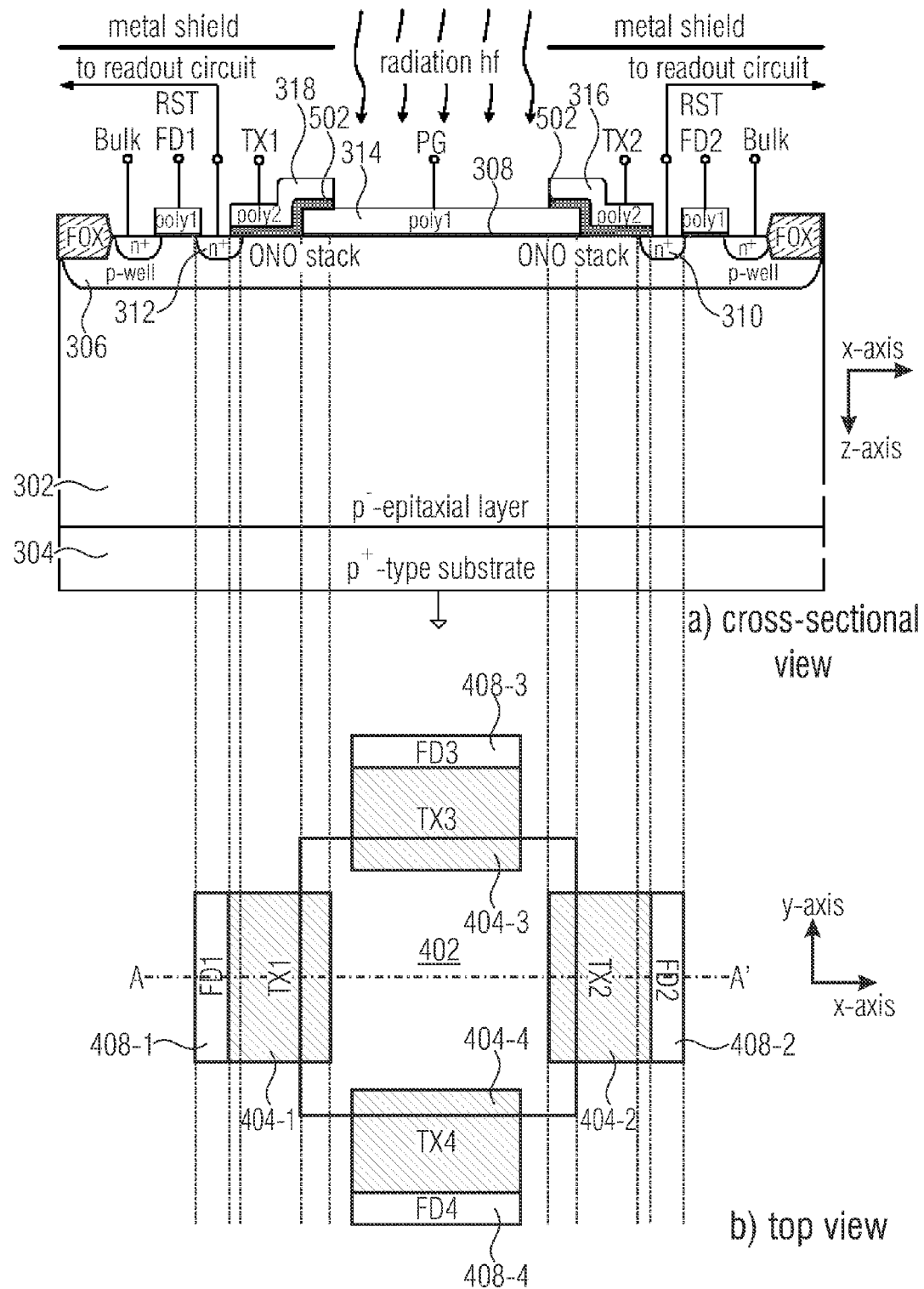
FIG. 5 is a cross-sectional illustration of the pixel structure in accordance with FIG. 4.

After having roughly described an inventive pixel structure using the top view shown in FIG. 4, FIG. 5 shows a more detailed cross-section of the pixel structure 400 along the AA' line of section.

Figure 3:
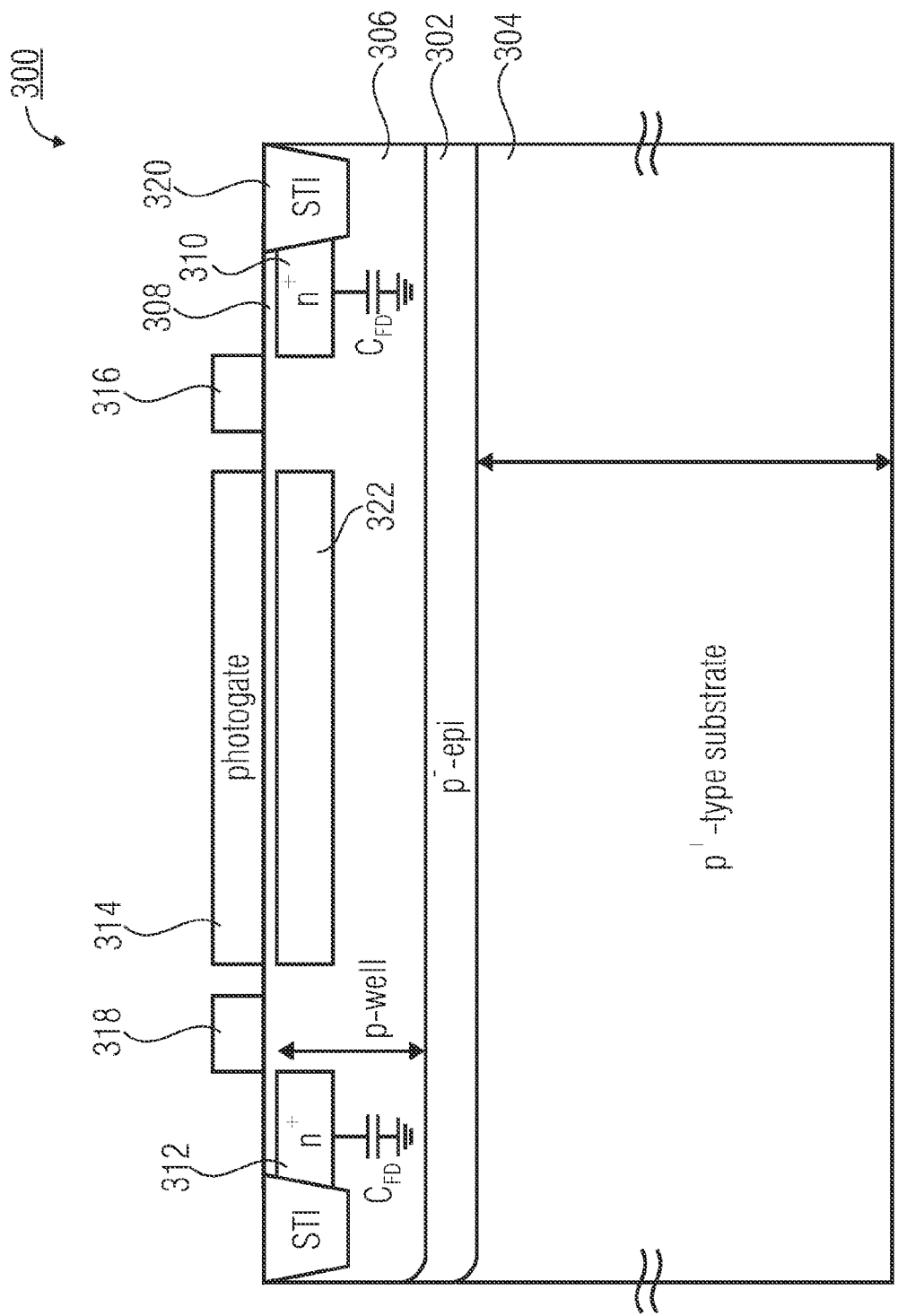
FIG. 3 is a semi-schematic cross-sectional illustration of a conventional ToF pixel structure based on a photogate.

What can be recognized is a setup similar to that already described referring to FIG. 3. The pixel structure 400 can be integrated on a p$^+$-type substrate and a p$^-$-epi layer 302 in a standard CMOS process. The photoactive region 402 or photogate PG is defined by an MOS capacitor made of a layer stack of a first polysilicon layer 314 (poly-1) on a thin silicon oxide 308 on a p-well 306. For transferring photo-generated charge carriers from the photoactive region 402, two MOS capacitors are used as transfer gates 404-n which are each defined by a layer stack of a second polysilicon layer (poly-2) on an oxide-nitride-oxide (ONO) insulation layer 502 on the p-well 306. Thus, the poly-2 layer 316, 318 and the respective ONO layer 502 of the transfer gate 404-n each partly overlap the poly-1 layer 314 of the photogate PG. The four poly-2 MOS capacitors here form the four transfer gates 404-n which overlap the, exemplarily, squared photogate PG at four edges and allow charge transfer between the photogate PF and the $n^+$-type diffusion regions 310, 312 (floating diffusions FDn). Each one of the floating diffusions FDn (n=1, ..., 4) is coupled to a reset transistor and a readout circuit (not shown), as will be described below.

After having explained above an exemplary setup of an inventive pixel structure 400, the mode of functioning of an active pixel sensor based thereon will be illustrated below using a circuit (FIG. 6) for an APS and a respective time diagram (FIG. 8) using which measuring a distance d including stray light correction will be illustrated.

Figure 6:
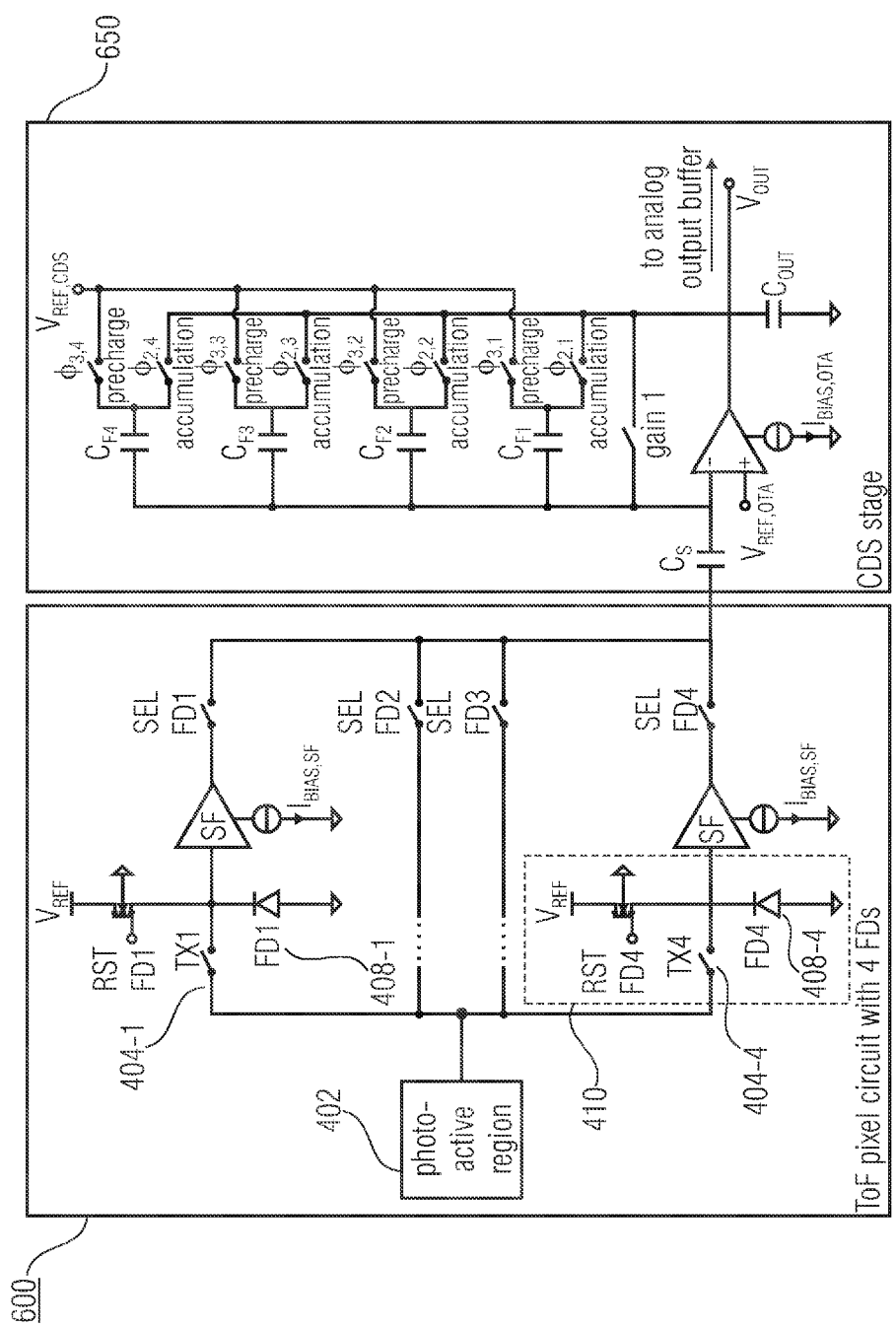
FIG. 6 is an illustration of an analog signal path of an inventive ToF pixel comprising four floating-diffusion read-out nodes and a respective CDS stage.

FIG. 6 shows a schematic setup of a runtime analog read-out circuit 600 for the pixel structure 400. Thus, the read-out circuit 600 comprises a respective read-out path for each one of the four transfer gates TXn or 404-n (n=1, ..., 4). The read-out capacities 408-n formed by the floating diffusions FDn (n=1, ..., 4) are biased to a reference potential $V_{REF}$ at the beginning of each illumination process via a reset switch RST FDn (n=1, ..., 4) which may be formed as a transistor. Each one of the four read-out paths additionally comprises a respective buffer amplifier SF. The buffer amplifiers SF are usually implemented as source followers and buffer the voltages applying across the barrier layer capacities of the floating diffusions FDn (n=1, ..., 4). The outputs of the buffer amplifiers SF are each connectable to a subsequent circuit 650 for correlated double sampling (CDS) via a select switch SEL FDn (n=1, ..., 4).

Further processing of the charge packages collected of the individual floating diffusions FDn (n=1, ..., 4) is, as is illustrated in FIG. 6, realized by typical active-pixel read-out circuits, each including three transistors and a downstream CDS stage 650. To each one of the four read-out nodes FDn (n=1, ..., 4), a reset transistor RST FDn (n=1, ..., 4) is connected, using which the barrier layer capacity of the respective floating diffusion FDn (n=1, ..., 4) is biased to a reference potential $V_{REF}$ during the reset phase. Within the charge carrier transfer phase and with the reset switched off, the respective barrier layer capacity 408-n (n=1, ..., 4) is discharged again in dependence on the charge carriers transferred. The measured signal applying at the four respective floating diffusions FDn (n=1, ..., 4) is buffered using four separate source followers SF and switched to the input of the CDS stage 650 using select switches SEL FDn (n=1, ..., 4). The CDS stage 650 comprises four feedback stages using which an additional N-fold accumulation for each of the four floating diffusions FDn (n=1, ..., 4) may be realized outside the actual APS pixel structure. Additionally, low-frequency noise portions of the analog path 600 can be eliminated using the CDS stage 650.

The charge carrier sink 410 is, in accordance with a preferred embodiment, formed connecting the evaluating capacity 408-4 formed by the fourth floating diffusion FD4, via the reset switch or transistor RST FD4, to the reference potential $V_{REF}$, via which the photo-generated charge carriers may dissipate. This means that the charge carrier sink 410 is formed by the floating-diffusion region 408-4 or FD4 coupled to the reference potential $V_{REF}$, which is associated to the transfer gate 404-4 or TX4, so that charge carriers may dissipate from the photoactive region 402 in the direction of the reference potential $V_{REF}$ via the transfer gate TX4 at all times outside the drive intervals of the other transfer gates TX1, TX2, TX3. Of course, the transistor RST FD4 which is in the permanent-reset state may also be omitted completely, so that in this case the fourth evaluating capacity 408-4 could be connected directly to the reference potential $V_{REF}$ to form the charge carrier sink. Correspondingly, the evaluating circuit downstream of the fourth floating diffusion FD4 comprising a buffer amplifier SF, a selection switch SEL FD4 and the corresponding branch in the CDS stage 650 may be omitted. However, it may be advisable to drive the four different floating diffusions FDn (n=1, ..., 4) randomly or differently in accordance with a predetermined scheme. Exemplarily, in a first measuring cycle, a configuration of the four floating diffusions may be used, as has been described above. In a subsequent measuring cycle, FD4 may exemplarily be used for accumulating charge carriers during the first drive interval and instead FD1 for sucking off photo-generated charge carriers outside the drive intervals of the remaining transfer gates TXn (n=2, 3, 4), so that FD4 would take the function of FD1 and vice versa. Manufacturing tolerances with regard to capacitances of the barrier layer capacities of the floating diffusions FDn (n=1, ..., 4) may be compensated by this procedure.

Figure 7:
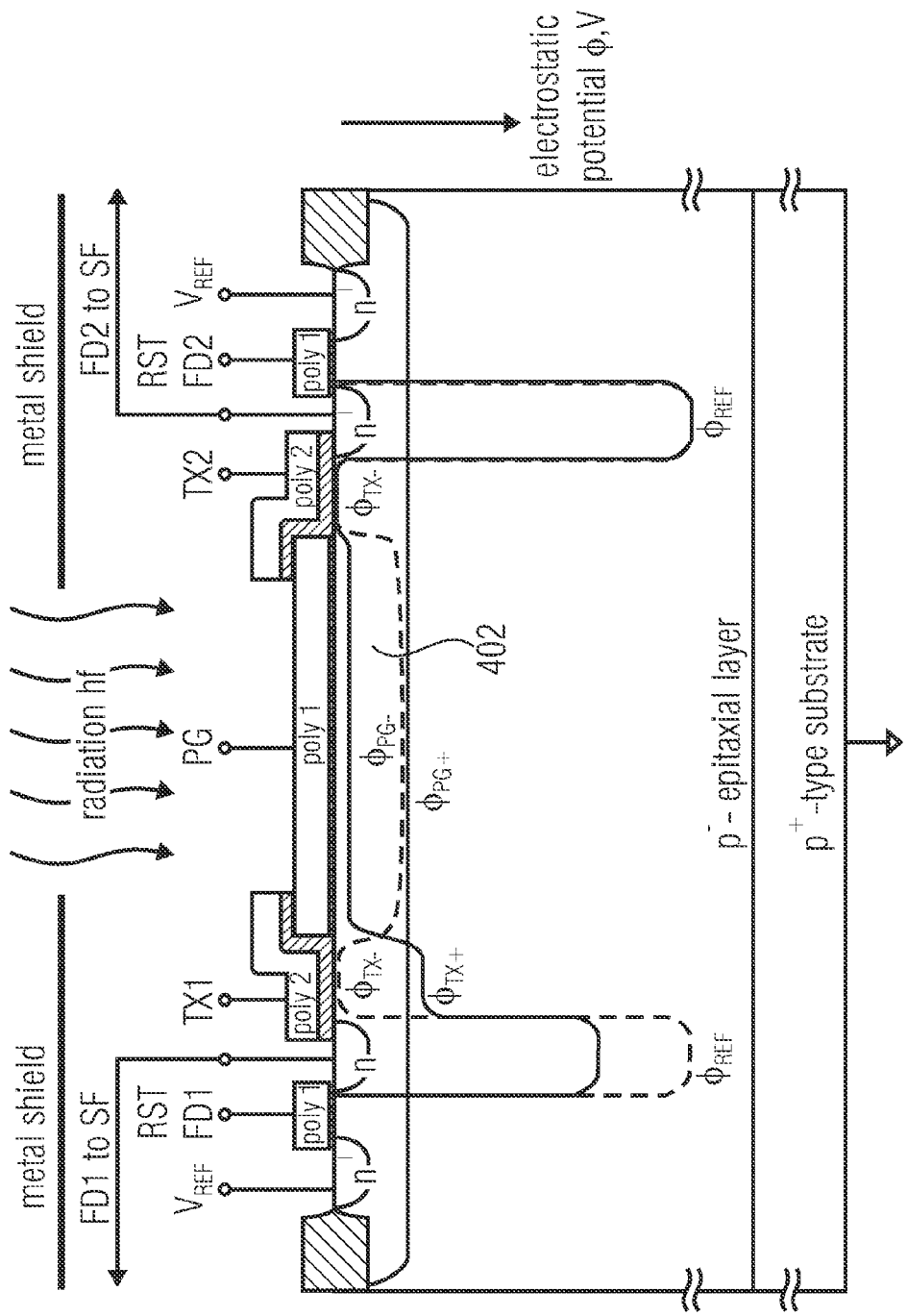
FIG. 7 is a schematic cross-sectional illustration of a photogate-based ToF pixel structure in accordance with a preferred embodiment of the present invention.

Exemplarily, a read-out concept of the inventive ToF pixel structure 400 will be explained using FIGS. 7 and 8 and arithmetics for determining the distance information d when at the same time suppressing the ambient light $E_{amb}$ be described. The photogate-based ToF pixel 400 which is shown in FIG. 7 in cross-section along the line AA', including the photogate PG, four transfer gates TXn, four floating diffusions FDn and the respective reset transistors RST FDn (n=1, ..., 4), is used here. Additionally, potential lines within the semiconductor material are illustrated in FIG. 7 for integration, reset and transfer phases. During a reset phase of a floating diffusion FDn (n=1, ..., 4), the respective transfer gate 404-n or TXn (n=1, ..., 4) is switched off ($\Phi_{TX-}$), i.e. the corresponding switch TXn (n=1, ..., 4) illustrated in FIG. 6 is opened. During this phase, the reference potential $\Phi_{REF}$ or $V_{REF}$ will settle at the corresponding floating diffusion FDn (n=1, ..., 4) or at the barrier layer capacitance thereof. Already during the reset phase, it is possible to start collecting (integrating) photo-generated charge carriers below the photo gate PG by generating a space charge zone by biasing the photogate electrode ($\Phi_{PG+}$). A transfer process of photo-generated charge carriers from the photoactive region 402 via the transfer gates 404-n or TXn (n=1, ..., 4) to the floating diffusions 408-n or FDn (n=1, ..., 4), may only take place when the following conditions for electrostatic potentials within the silicon are fulfilled.

$$\Phi_{TX}{}^+ > \Phi_{PG}{}^+ > \Phi_{PG}{}^- > \Phi_{TX}{}^- \qquad (2)$$

When looking at the potential lines illustrated in FIG. 7, it is to be recognized that, with a biased photogate electrode ($\Phi_{PG+}$) and a driven transfer gate TX1 ($\Phi_{TX1+}$), there is a potential drop in the direction of the first read-out capacity 404-1 formed by the first floating diffusion FD1 so that the charge carriers can be transported from the photoactive region 402 below the photogate PG towards the floating diffusion FD1. Charge transport from the photoactive region 402 towards the second floating diffusion FD2, however, is not possible when the second transfer gate TX2 ($\Phi_{TX2-}$) is not driven. When, however TX2 is driven ($\Phi_{TX2+}$) and TX1 is not driven ($\Phi_{TX1-}$), the contrary will apply, i.e. charge carriers are transported from the photoactive region 402 towards the second floating diffusion FD2. The same applies for the other transfer gates TXn or 404-*n* (n=3, 4) and the corresponding floating diffusions.

The timeline of a ToF measurement including an inventive pixel structure 400 will be discussed below in greater detail referring to a timeline diagram 800 illustrated in FIG. 8.

Figure 8:
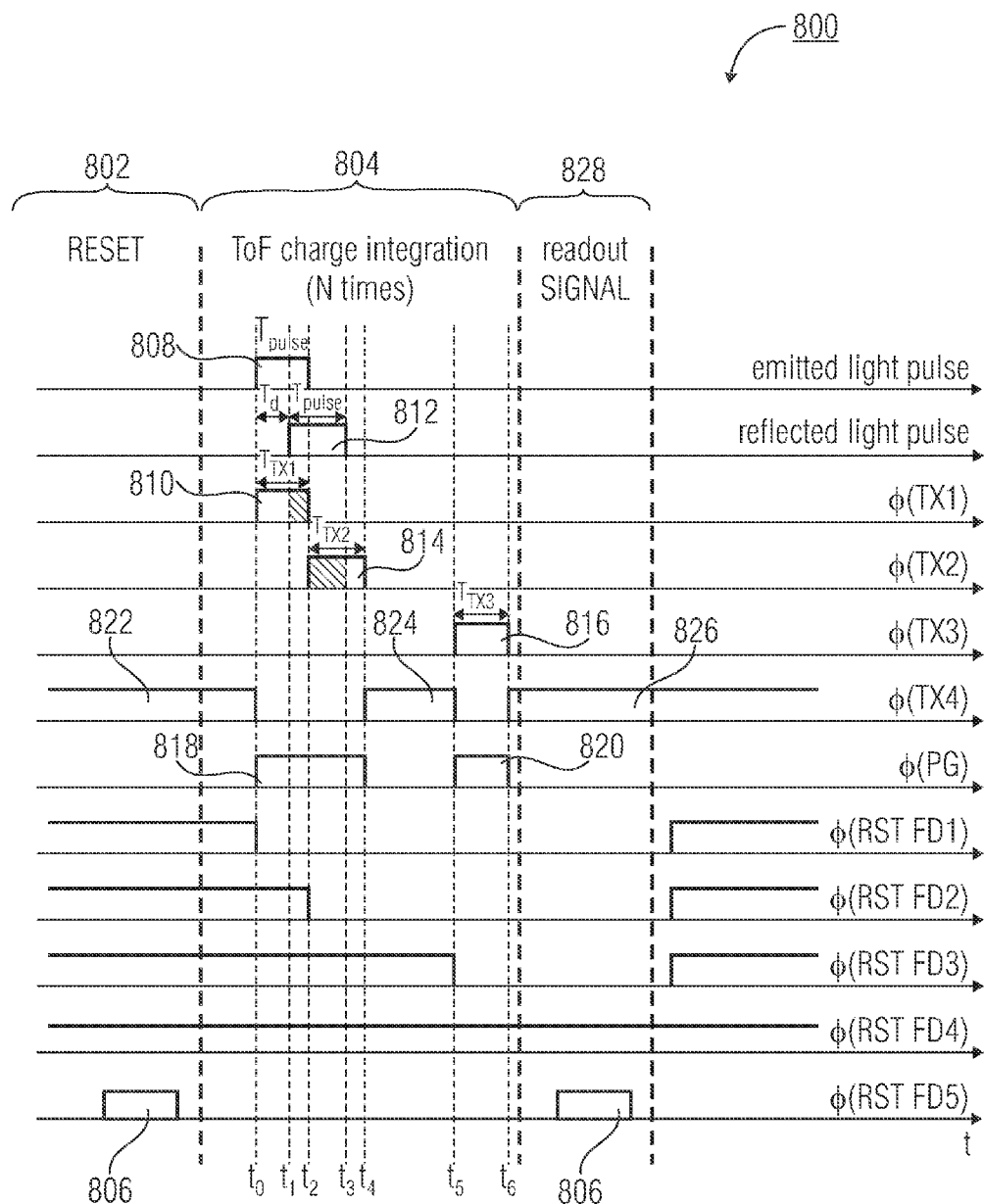
FIG. 8 is a schematic illustration of a timeline of drive signals for controlling an inventive pixel structure.

FIG. 8 shows potential lines for both the four transfer gates TXn (n=1, . . . , 4) and for the photogate PG plotted against the time t in any units. What is also illustrated are potential lines for the reset transistors RST FDn (n=1, . . . , 4) and the select switches SEL FDn (n=1, . . . , 4). The time axis is roughly divided into three phases: reset phase, charge integration phase and read-out phase.

In the reset phase 802, all the floating diffusions FDn (n=1, . . . , 4) are biased to the reference potential ($\Phi_{REF}$) via their respectively associated reset transistors RST FDn (n=1, . . . , 4), which is why drive potentials $\Phi$(RST FDn) of the reset transistors are in a "high" state. In the reset phase 802, neither the transfer gates TXn (n=1, . . . , 4) nor the photogate PG are driven by the control circuit 406, which means that the switches TXn (n=1, . . . , 4) shown in FIG. 6 are all opened and that no space charge zone forms below the photogate electrode 314. In the reset phase 802, i.e. before a ToF integration cycle 804, the four floating diffusions FDn (n=1, . . . , 4) are reset and the reset level ($\Phi_{REF}$) is stored in the CDS stage 650 as a reference, which is why the select switches SEL FDn (n=1, . . . , 4) are each driven or closed in the reset phase 802 as is indicated by reference numeral 806.

In the ToF integration phase 804, at a time $t_0$, an optical radiation pulse of a pulse duration $T_{pulse}$ is emitted (808) and at the same time the first "shutter" window is activated by driving the first transfer gate TX1 in a first drive interval 810. Thus, the first drive interval 810 is synchronized in time with the pulse emitted 808. This means that the first drive interval 810 of the first transfer gate TX1 extends from the time $t_0$ to the time $t_2$ over a duration $T_{pulse}$. Depending on the temporal delay $T_d$ of a radiation pulse 812 reflected back, there is a charge package $Q_{FD1}$ in the first floating diffusion FD1 or the barrier layer capacity thereof at the time $t_2$, in accordance with:

$$Q_{FD1} r(I_{amb} \cdot T_{pulse} + I_{pulse} \cdot (T_{pulse} - T_d)) \quad (3)$$

Thus, during the entire first drive interval 810, i.e. the pulse duration $T_{pulse}$, a photo current $I_{amb}$ is generated by the ambient light $E_{amb}$, wherein in the time window $T_{pulse} - T_d$, i.e. $t_1$ to $t_2$, the current $I_{amb}$ is superimposed by a portion $I_{pulse}$ of the reflected radiation pulse 812. Directly after the first drive interval $T_{TX1}$ 810, i.e. after switching off the first shutter, in a second drive interval $T_{TX2}$ 814 ($t_2$-$t_4$) the second "shutter" becomes active by driving the second transfer gate TX2 and takes up the residual portion of the reflected radiation pulse 812. The second drive interval 814 in accordance with one preferred embodiment also corresponds to the pulse duration $T_{pulse}$ so that in a time window $t_2$ to $t_3$, which corresponds to the delay time $T_d$, the photo current $I_{amb}$ caused by the ambient light $E_{amb}$ is superimposed by a portion $I_{pulse}$ of the reflected radiation pulse 812. After the second drive interval $T_{TX2}$ has ended, the charge package $Q_{FD2}$ in accordance with $$Q_{FD2} = r(I_{amb} \cdot T_{pulse} + I_{pulse} \cdot T_d) \quad (4)$$

is contained in the second floating diffusion FD2 or the barrier layer thereof. For determining the ambient light portion, after a certain downtime, which corresponds to the time interval $t_4$ to $t_5$ (816), the third transfer gate TX3 is driven for a time $T_{TX3} = T_{pulse}$ and the resulting charge package $Q_{FD3}$ is stored in the third floating diffusion FD3 or the barrier layer capacity thereof:

$$Q_{FD3} = r(I_{amb} \cdot T_{pulse}) \quad (5)$$

During the drive intervals $T_{TX1}$, $T_{TX2}$ and $T_{TX3}$ of the three transfer gates TXn (n=1, 2, 3), the photogate PG is additionally positively biased so as to generate a space charge zone in the region of the photoactive region 402. This is indicated by the reference numerals 818 and 820. At all other times t, this space charge zone is reduced to a minimum extension close to the surface and the fourth transfer gate TX4 is driven, which is indicated by the reference numerals 822, 824 and 826. The fourth floating diffusion FD4 or the barrier layer capacity thereof is, during the intervals 822, 824 and 826, so to speak in a permanent reset state and has all undesired charge carriers generated thermally and by ambient light flow in the direction of the reference potential ($\Phi_{REF}$).

As can be gathered from the timeline diagram of FIG. 8, the control circuit 406 is configured to cyclically drive the plurality of transfer gates TXn within a charge integration cycle. In every charge integration cycle, the at least two ones of the plurality of transfer gates TXn are driven each at least once so that charge carriers generated during the drive intervals 810, 814, 816 can be transported from the photoactive region 402 to evaluating capacities 408 each coupled to the at least two transfer gates. Additionally, the other transfer gate 404-4 or TX4 is not driven during the drive intervals 810, 814, 816 of the at least two transfer gates so that the photoactive region 402 is not connected to the reference potential terminal during drive intervals of the at least two transfer gates. Furthermore, the other transfer gate 404-4 or TX4 is driven, in every cycle, at least once during a time 822, 824, 826 outside the drive intervals 810, 814, 816 of the at least two transfer gates to connect the photoactive region 402 to the reference potential terminal via the other transfer gate 404-4 or TX4. This means that at least one of the plurality of transfer gates 404-*n* or TXn (n=1, . . . , 4) is driven at every time during the cycle.

In accordance with one preferred embodiment of the present invention, the control circuit 406 is configured to drive the first transfer gate TX1 during the first drive interval 810 synchronized with the radiation pulse 808 of a radiation source so that first charge carriers generated during the first drive interval 810 can be transported from the photoactive region 402 to a first evaluating capacity 408-1 formed by the first floating diffusion FD1. Additionally, the control circuit 406 is configured to drive a second transfer gate TX2 during a second drive interval 814 which directly follows the first drive interval 810 so that second charge carriers generated during the second drive interval 814 can be transported from the photoactive region 402 to an evaluating capacity 408-2 formed by the second floating diffusion FD2. The control circuit 406 is additionally configured to drive a third transfer gate TX3 during a third drive interval 816 which is outside the first and second drive intervals 810, 814 so that third charge carriers generated during the third drive interval 816 can be transported from the photoactive region 402 to a third evaluating capacity 408-3 formed by the third floating diffusion FD3. The control circuit 406 drives the fourth transfer gate TX4 during all other times outside the first, second and third control intervals 810, 814, 816 to connect the photoactive region 402 to the charge carrier sink 410.

Thus, the duration $T_{TXn} = T_{pulse}$ (n=1, . . . , 4) of the drive intervals 810, 814, 816 shown in FIG. 8 is not compelling. The control circuit 406 may also be configured to drive the four transfer gates TXn (n=1, . . . , 4) such that the first, second and third drive intervals 810, 814, 816 each correspond to a multiple of a pulse duration $T_{pulse}$, depending on a delay time $T_d$ to be expected of a radiation pulse reflected from the object of measurement 104, i.e. $T_{TXn} = i \ast T_{pulse}$ (n=1, . . . , 4; i$\in$N$_0^+$).

The time delay $T_d$ can be determined from the charge packages $Q_{FD1}$, $Q_{FD2}$ and $Q_{FD3}$ or voltages derived there-from. Additionally, the active pixel structure 400 is coupled to an evaluating circuit which at first subtracts the ambient charge $Q_{FD3}$ from the two signal-containing charges $Q_{FD1}$ and $Q_{FD2}$ for this. After several transformations, the time delay $T_d$ may be expressed as follows:

$$T_d = T_{pulse} \frac{Q_{FD2} - Q_{FD3}}{Q_{FD1} + Q_{FD2} - 2Q_{FD3}} \quad (6)$$

wherein the reflectance r of the object of measurement 104 is reduced from the equation. Taking equation (1) into consideration, the measuring distance d is:

$$d = \frac{c}{2} T_d = \frac{c}{2} \frac{Q_{FD2} - Q_{FD3}}{Q_{FD1} + Q_{FD2} - 2Q_{FD3}} T_{pulse}. \quad (7)$$

When the floating-diffusion areas are selected to be equal and thus the read-out capacities 408 are equal, the distance d can be determined directly from the voltages measured at the barrier layer capacities of the floating diffusions FDn (n=1, 2, 3) as follows:

$$d = \frac{c}{2} \frac{V_{FD2} - V_{VD3}}{V_{FD1} + V_{FD2} - 2V_{FD3}} T_{pulse}. \quad (8)$$

Calculating a difference of reset level $\Phi_{REF}$ and signal values of the floating-diffusion voltages, from which the voltages $V_{FDn}$ result, is performed in the CDS stage 650. Further processing of calculations of the distance values d may either take place through circuit technology in an "on chip" manner or externally using software.

Using an inventive ToF pixel and the respective read-out concept, a 3D image sensor having a pixel array of, for example, 4×16 pixels may be realized. Thus, the inventive active pixel structures may be manufactured exemplarily by means of a standard 0.35 μm CMOS process. When a pulsed near infrared (NIR) laser (wavelength λ=905 nm) of pulse widths of 30 ns $T_{pulse}$≤60 ns is used as a light source, distance measurements of up to d=9 m are possible. The photogate region 402 may exemplarily have a size of 30×30 μm², the transfer gates TXn (n=1, ..., 4) may exemplarily each have a length of 3 μm and the floating-diffusion regions FDn (n=1, ..., 4) may exemplarily be varied in a range of 20×1.5 μm² up to 20×9 μm², which corresponds to barrier layer capacities ($C_{FD}$) in a range of 12 fF to 72 fF for the reset state ($\Phi_{FD}=\Phi_{REF}$=3.3 V).

Inventive ToF pixel structures and the respective read-out concept are limited not only to photogate-based APS, among which there are also pixel structures which improve the transport characteristics of the photo-generated charges by special technological and layout-related optimizing. These improvements may exemplarily have been achieved by "buried channel" implantations close to the surface or high-resistance polysilicon gates. Rather, the inventive concept will also work using pinned or buried photodiode-based APS or, generally, using any kind of photodiode-based APS which offers a way of specific charge transfer by a control or transfer gate, such as, for example, even pixel structures comprising lateral drift-field photodiodes.

By using the inventive concept it becomes possible to perform the distance measurement using only one laser pulse. Thus, the laser energy needed may be halved compared to conventional art and, at the same time, the measuring speed be doubled. The result is an optimum correlation possible of distance and normalization measured values (reflectivity, attenuation due to distance), which makes the inventive concept also suitable for strongly time-varying scenarios, like, for example, very fast-moving objects of measurement 104.

The ambient light $E_{air}$ may, in the third drive interval 816, be taken up within the pixel structure 400 already nearly at the same time as the reflected radiation pulse and subsequently be subtracted from the useful signal, since the downtime ($t_4$–$t_5$) between the second drive interval 814 and the third drive interval 816 is very low, i.e. in the order of magnitude of a pulse duration $T_{pulse}$. This also increases the measuring speed. However, it is not absolutely necessary to use the third transfer gate TX3 and the third floating diffusion FD3 to detect the ambient light $E_{amb}$ in the third drive interval 816. In accordance with another preferred embodiment, the voltage at the barrier layer capacities of the two floating diffusions FD1 and FD2 may also be read out directly after the first and second drive intervals 810, 814 so that, after a short reset phase, in the third drive interval 816, either the first or second transfer gate TX1, TX2 is driven to transfer charge carriers generated by the ambient light $E_{amb}$ to the corresponding floating diffusion FD1 or FD2, which is then evaluated in another read-out phase. In this preferred embodiment, only three transfer gates TX1, TX2 and TX4 are needed (for "sucking off"), which, however, means a reduction in the measuring speed achievable compared to preferred embodiment s using four transfer gates.

By separating the detection and read-out nodes, the reset noise in preferred embodiment s is not dependent on the photoactive area 402 and may thus be reduced considerably with small selected floating diffusions. This advantage becomes especially prominent when using large-area photoactive regions.

By permanently "sucking off" charge carriers generated by ambient illumination during downtimes 822, 824, 826 in the first, second and third drive intervals, charges on the read-out capacities of the floating diffusions FDn (n=1, 2, 3) can be prevented from being corrupted by charge carriers set free by the ambient illumination up to the read-out interval 828. This allows considerably more precise measuring results compared to conventional art.

Furthermore, the inventive concept offers a way of N-fold charge accumulation already within the floating diffusions of the pixel structure. This means that the course of radiation pulses and drive intervals as illustrated in FIG. 8 may be repeated N times during the ToF charge integration 804 so that there is at least approximately the N-fold amount of charge on each read-out capacity at the end of the interval 804. This allows minimizing the contribution of the reset noise and increasing the dynamic range and the signal-to-noise ratio.

Although some aspects of the present invention have been described in connection with a device, it is to be pointed out that these aspects also represent a description of the corresponding method so that a block or an element of a device is also to be understood as a corresponding method step or as a feature of a method step. In analogy, aspects having been described in connection with a method step or as a method step also represent a description of the corresponding block or detail or feature of a corresponding device.

Depending on the specific implementation requirements, preferred embodiment s of the invention may be implemented in either hardware or software. The implementation may be performed using a digital storage medium, such as, for example, a floppy disc, a DVD, a Blue Ray disc, a CD, ROM, PROM, EPROM, EEPROM or Flash memory, a hard disc drive or another magnetic or optical memory on which control signals which may be read electronically are stored which may cooperate or do cooperate with a programmable computer system such that the respective method will be executed. This is why the digital storage medium may be computer-readable. Some preferred embodiment s in accordance with the invention thus include a data carrier comprising control signals which may be read electronically which are able to cooperate with a programmable computer system such that one of the methods described here will be executed.

Generally, preferred embodiment s of the present invention may be implemented as a computer program product having program code, the program code being effective for executing one of the methods when the computer program product runs on a computer or a microcontroller. The program code may exemplarily also be stored on a machine-readable carrier.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. A pixel structure for optical distance measurement, comprising:
   a semiconductor substrate;
   a photoactive region integrated on the substrate and arranged to charge carriers responsive to radiation incident on the photoactive region;
   a reference potential terminal for a reference potential acting as a charge carrier sink;
   a plurality of at least three evaluating capacities in the form of floating-diffusion regions which are arranged around the photoactive region so as to be laterally spaced apart from an edge of the photoactive region;
   a plurality of at least four transfer gates in the form of MOS capacitors configured to transport the charge carriers generated from the photoactive region, wherein at least three of the plurality of transfer gates are configured to transport the charge carriers generated from the photoactive region to a respective evaluating capacity; and
   a control circuit configured to cyclically drive, in each cycle:
      a first one of the at least three transfer gates during a first drive interval synchronized with a radiation pulse of a radiation source so that first charge carriers generated during the first drive interval can be transported from the photoactive region to a first evaluating capacity,
      a second one of the at least three transfer gates during a second drive interval synchronized with a radiation pulse of a radiation source which is outside first drive interval so that second charge carriers generated during the second drive interval can be transported from the photoactive region to a second evaluating capacity,
      a third one of the at least three transfer gates during a third drive interval outside the first and second drive intervals so that third charge carriers generated during the third drive interval can be transported from the photoactive region to a third evaluating capacity, and
      the other one of the four transfer gates during a time outside the first, second and third drive intervals to connect the photoactive region to the reference potential terminal,
   so that at least one of the plurality of the transfer gates is driven at every point in time during the cycle.

2. The pixel structure in accordance with claim 1, wherein the control circuit is configured such that the second drive interval directly follows the first drive interval.

3. The pixel structure in accordance with claim 2, wherein the control circuit is configured to drive the plurality of transfer gates such that the first, second and third drive intervals each correspond to a multiple of a pulse duration of the radiation pulse, depending on a delay time to be expected of a radiation pulse reflected from the object of measurement.

4. The pixel structure in accordance with claim 2, wherein the control circuit is configured to drive the plurality of transfer gates such that the first drive interval is temporally parallel to the radiation pulse of the radiation source so that the first, second and third drive intervals each correspond to the pulse duration of the radiation pulse.

5. The pixel structure in accordance with claim 2, further comprising an evaluating circuit which is coupled to the evaluating capacities and is configured to determine a distance d to the object of measurement based on:

$$d = \frac{c}{2} \frac{Q_{FD,2} - Q_{FD,3}}{Q_{FD,1} + Q_{FD,2} - 2Q_{FD,3}} T_{pulse}$$

wherein c represents the speed of light, $Q_{FD,1}$ represents charges accumulated on the first evaluating capacity during the first drive interval, $Q_{FD,2}$ represents charges accumulated on the second evaluating capacity during the second drive interval, $Q_{FD,3}$ represents charges accumulated on the third evaluating capacity during the third drive interval, and $T_{pulse}$ represents the pulse duration of the radiation pulse.

6. The pixel structure in accordance with claim 1, wherein the evaluating capacities coupled to transfer gates are each formed by n-doped floating-diffusion regions in the semiconductor substrate.

7. The pixel structure in accordance with claim 1, wherein the evaluating capacities coupled to the transfer gates are each coupled to a reference potential via a reset transistor to charge the evaluating capacities each to the reference potential during a reset interval.

8. The pixel structure in accordance with claim 1, wherein the photoactive region is formed by a photogate comprising a first polysilicon layer on a silicon-oxide layer above a semiconductor substrate.

9. The pixel structure in accordance with claim 1, wherein the transfer gates are each formed of a layer stack of a polysilicon layer above an oxide-nitride-oxide layer on a semiconductor substrate, and wherein the polysilicon layer and the oxide-nitride-oxide layer partly overlap a polysilicon layer of a photogate of the photoactive region.

10. The pixel structure in accordance with claim 1, wherein the charge carrier sink is formed by a floating-diffusion region coupled to the reference potential, which is associated to the other transfer gate so that charge carriers may dissipate from the photoactive region via the other transfer gate in the direction of the reference potential during the entire time outside the drive intervals of the at least two transfer gates.

11. A system for optical distance measurement, comprising:
- a radiation source arranged to emit a radiation pulse in the direction of an object of measurement;
- a pixel structure for optical distance measurement, comprising: a semiconductor substrate; a photoactive region integrated on the substrate and arranged to generate charge carriers responsive to radiation incident on the photoactive region; a reference potential terminal for a reference potential acting as a charge carrier sink; a plurality of at least three evaluating capacities in the form of floating-diffusion regions which are arranged around the photoactive region so as to be laterally spaced apart from an edge of the photoactive region; a plurality of at least four transfer gates in the form of MOS capacitors configured to transport the charge carriers generated from the photoactive region, wherein at least three of the plurality of transfer gates are configured to transport the charge carriers generated from the photoactive region to a respective evaluating capacity; and a control circuit configured to cyclically drive, in each cycle: a first one of the at least three transfer gates during a first drive interval synchronized with a radiation pulse of a radiation source so that first charge carriers generated during the first drive interval can be transported from the photoactive region to a first evaluating capacity, a second one of the at least three transfer gates during a second drive interval synchronized with a radiation pulse of a radiation source which is outside first drive interval so that second charge carriers generated during the second drive interval can be transported from the photoactive region to a second evaluating capacity, a third one of the at least three transfer gates during a third drive interval outside the first and second drive intervals so that third charge carriers generated during the third drive interval can be transported from the photoactive region to a third evaluating capacity, and the other one of the four transfer gates during a time outside the first, second and third drive intervals to connect the photoactive region to the reference potential terminal, so that at least one of the plurality of the transfer gates is driven at every point in time during the cycle; and
- a synchronization unit arranged to synchronize the radiation source and the control circuit of the pixel structure so that the control circuit drives the transfer gates such that the drive intervals of the at least two transfer gates are dependent on the radiation pulse.

12. A method for optical distance measurement by means of a pixel structure comprising: a semiconductor substrate, a photoactive region integrated on the substrate and arranged to generate charge carriers responsive to radiation incident on the photoactive region, a reference potential terminal for a reference potential acting as a charge carrier sink, a plurality of at least three evaluating capacities in the form of floating-diffusion regions which are arranged around the photoactive region so as to be laterally spaced apart from an edge of the photoactive region, and a plurality of at least four transfer gates in the form of MOS capacitors configured to transport the charge carriers generated from the photoactive region, wherein at least three of the plurality of transfer gates are configured to transport the charge carriers generated from the photoactive region to a respective evaluating capacity, wherein the method comprises, performed cyclically per cycle:

driving a first one of the at least three transfer gates during a first drive interval synchronized with a radiation pulse of a radiation source so that first charge carriers generated during the first drive interval can be transported from the photoactive region to a first evaluating capacity, driving a second one of the at least three transfer gates during a second drive interval synchronized with a radiation pulse of a radiation source which is outside the first drive interval so that second charge carriers generated during the second drive interval can be transported from the photoactive region to a second evaluating capacity, driving a third one of the at least three transfer gates during a third drive interval outside the first and second drive intervals so that third charge carriers generated during the third drive interval can be transported from the photoactive region to a third evaluating capacity, and continuously driving the other one of the four transfer gates during a time outside the first, second and third drive intervals to connect the photoactive region to the reference potential terminal, so that at least one of the plurality of the transfer gates is driven at every point in time during the cycle.

13. The method in accordance with claim 12, wherein the four transfer gates are driven such that the first drive interval is temporarily parallel to the radiation pulse of the radiation source and such that the first, second and third drive intervals each correspond to the pulse duration of the radiation pulse.

14. The method in accordance with claim 12, wherein a distance d to the object of measurement is determined based on:

$$d = \frac{c}{2} \frac{Q_{FD,2} - Q_{FD,3}}{Q_{FD,1} + Q_{FD,2} - 2Q_{FD,3}} T_{pulse}$$

wherein c represents the speed of light, $Q_{FD,1}$ represents charges accumulated on the first evaluating capacity during the first drive interval, $Q_{FD,2}$ represents charges accumulated on the second evaluating capacity during the second drive interval, $Q_{FD,3}$ represents charges accumulated on the third evaluating capacity during the third drive interval, and $T_{pulse}$ represents the pulse duration of the radiation pulse.

15. A non-transitory computer-readable medium including a computer program comprising a program code for performing, when the computer program is performed on a computer or a microcontroller, a method for optical distance measurement by means of a pixel structure comprising: a semiconductor substrate, a photoactive region integrated on the substrate and arranged to generate charge carriers responsive to radiation incident on the photoactive region, a reference potential terminal for a reference potential acting as a charge carrier sink, a plurality of at least three evaluating capacities in the form of floating-diffusion regions which are arranged around the photoactive region so as to be laterally spaced apart from an edge of the photoactive region, and a plurality of at least four transfer gates in the form of MOS capacitors configured to transport the charge carriers generated from the photoactive region, wherein at least three of the plurality of transfer gates are configured to transport the charge carriers generated from the photoactive region to a respective evaluating capacity, wherein the method comprises, performed cyclically per cycle: driving a first one of the at least three transfer gates during a first drive interval synchronized with a radiation pulse of a radiation source so that first charge carriers generated during the first drive interval can be transported from the photoactive region to a first evaluating capacity, driving a second one of the at least three transfer gates during a second drive interval synchronized with a radiation pulse of a radiation source which is outside the first drive interval so that second charge carriers generated during the second drive interval can be transported from the photoactive region to a second evaluating capacity, driving a third one of the at least three transfer gates during a third drive interval outside the first and second drive intervals so that third charge carriers generated during the third drive interval can be transported from the photoactive region to a third evaluating capacity, and continuously driving the other one of the four transfer gates during a time outside the first, second and third drive intervals to connect the photoactive region to the reference potential terminal, so that at least one of the plurality of the transfer gates is driven at every point in time during the cycle.

16. A pixel structure for optical distance measurement, comprising:
a photoactive region arranged to generate charge carriers responsive to radiation incident on the photoactive region;
a reference potential terminal for a reference potential acting as a charge carrier sink;
a plurality of at least three evaluating capacities in the form of floating-diffusion regions which are arranged around the photoactive region, each evaluating capacity being laterally spaced apart from an edge of the photoactive region;
a plurality of transfer gates including MOS capacitors configured to transport the charge carriers generated from the photoactive region, wherein at least three of the plurality of transfer gates are configured to transport the charge carriers generated from the photoactive region to a respective evaluating capacity; and
a control circuit configured to drive the plurality of transfer gates in a manner synchronized to a pulse-wise irradiation of object for run-time measurement.

17. The pixel structure in accordance with claim 1, wherein:
the control circuit is configured to drive at least two different ones of the plurality of transfer gates during different periodical drive intervals so that charge carriers generated during the drive intervals by at least one of a radiation pulse reflected by the object upon the pulse-wise irradiation and ambient radiation can be transported from the photoactive region to evaluating capacities each coupled to the at least two transfer gates,
the control circuit is configured to control another one of the plurality of transfer gates during a time outside the drive intervals of the at least two transfer gates to connect the photoactive region to the reference potential terminal acting as a charge carrier sink during the time outside the drive intervals of the at least two transfer gates, and
the control circuit is configured to cyclically drive the plurality of transfer gates and to drive each of the plurality of transfer gates at least once in every cycle so that charge carriers generated during the drive intervals can be transported from the photoactive region to evaluating capacities each coupled to the at least two transfer gates, and not to drive the other transfer gate during the drive intervals of the at least two transfer gates so that the photoactive region is not connected to the reference potential terminal during drive intervals of the at least two transfer gates, and to drive the other transfer gate at least once during the time outside the drive intervals of the at least two transfer gates in every cycle to connect the photoactive region to the reference potential terminal via the other transfer gate so that at least one of the plurality of transfer gates is driven at any time during the cycle.

18. The pixel structure in accordance with claim 1, further comprising four transfer gates, wherein the control circuit is configured to drive a first one of the four transfer gates during a first drive interval synchronized with a radiation pulse of a radiation source so that first charge carriers generated during the first drive interval can be transported from the photoactive region to a first evaluating capacity, wherein the control circuit is configured to drive a second one of the four transfer gates during a second drive interval directly following the first drive interval so that second charge carriers generated during the second drive interval can be transported from the photoactive region to a second evaluating capacity, wherein the control circuit is configured to drive a third one of the four transfer gates during a third drive interval outside the first and second drive intervals so that third charge carriers generated during the third drive interval can be transported from the photoactive region to a third evaluating capacity, and wherein the control circuit is configured to continuously drive the other one of the four transfer gates during a time outside the first, second and third drive intervals to connect the photoactive region to the reference potential terminal.

19. The pixel structure in accordance with claim 16, wherein each of the at least three transfer gates comprises an electrode partially overlapping the photoactive region and extending to the respective evaluating capacity.

20. The pixel structure in accordance with claim 16, wherein the photoactive region is defined by a photogate, and each of the at least three transfer gates comprises an electrode partially overlapping the photogate of the photoactive region and extending to the respective evaluating capacity.

21. The pixel structure in accordance with claim 16, wherein the control circuit is configured to drive the plurality of transfer gates cyclically, and drive, per cycle, a first one of the plurality of transfer gates during a first drive interval synchronized with a radiation pulse of a radiation source so that first charge carriers generated during the first drive interval can be transported from the photoactive region to a first evaluating capacity, a second one of the plurality of the transfer gates during a second drive interval directly following the first drive interval so that second charge carriers generated during the second drive interval can be transported from the photoactive region to a second evaluating capacity, a third one of the plurality of transfer gates during a third drive interval outside the first and second drive intervals so that third charge carriers generated during the third drive interval can be transported from the photoactive region to a third evaluating capacity, and a fourth one of the plurality of transfer gates during a time outside the first, second and third drive intervals to connect the photoactive region to a reference potential terminal acting as a charge carrier sink, with changing, between cycles, which of the plurality of transfer gates is the first, second, third and fourth transfer gate.

* * * * *